United States Patent
Schröder

(10) Patent No.: US 11,822,421 B2
(45) Date of Patent: Nov. 21, 2023

(54) APPARATUS AND METHOD FOR DIAGNOSING FAULTS

(71) Applicant: Dr. Ing. h.c. F. Porsche Aktiengesellschaft, Stuttgart (DE)

(72) Inventor: Julius Schröder, Stuttgart (DE)

(73) Assignee: Dr. Ing. h.c. F. Porsche Aktiengesellschaft

(*) Notice: Subject to any disclaimer, the term of this patent is extended or adjusted under 35 U.S.C. 154(b) by 0 days.

(21) Appl. No.: 17/829,478

(22) Filed: Jun. 1, 2022

(65) Prior Publication Data
US 2023/0009658 A1 Jan. 12, 2023

(30) Foreign Application Priority Data
Jul. 7, 2021 (DE) .......................... 102021117498.8

(51) Int. Cl.
*G06F 11/07* (2006.01)
*G06F 11/30* (2006.01)
*G06F 30/27* (2020.01)

(52) U.S. Cl.
CPC ........ *G06F 11/079* (2013.01); *G06F 11/0709* (2013.01); *G06F 11/3027* (2013.01); *G06F 30/27* (2020.01)

(58) Field of Classification Search
CPC . G06F 11/079; G06F 11/0709; G06F 11/3027
See application file for complete search history.

(56) References Cited

U.S. PATENT DOCUMENTS

| | | | |
|---|---|---|---|
| 5,347,541 A * | 9/1994 | Iltis ..................... | H04L 25/0307 375/232 |
| 10,410,115 B2 * | 9/2019 | Lewis ..................... | G06N 3/045 |
| 10,528,600 B1 * | 1/2020 | Ni ......................... | G06Q 10/063 |
| 2011/0191079 A1 * | 8/2011 | Rzehorska ........... | G01M 17/007 703/8 |
| 2014/0012947 A1 * | 1/2014 | Schaller ................. | H04L 67/02 709/217 |
| 2019/0371087 A1 * | 12/2019 | Shin ....................... | G08G 1/0175 |
| 2021/0366207 A1 | 11/2021 | Seidel et al. | |
| 2022/0027823 A1 * | 1/2022 | Singh ................ | G06Q 10/06311 |
| 2022/0398876 A1 * | 12/2022 | Gumaste .............. | G07C 5/0808 |

FOREIGN PATENT DOCUMENTS

DE 102018109195 A1 10/2019

* cited by examiner

*Primary Examiner* — Jigar P Patel
(74) *Attorney, Agent, or Firm* — RatnerPrestia

(57) ABSTRACT

A method and apparatus for diagnosing faults. The apparatus includes an interface to a communication device which can be used by participants, in particular control devices and/or sensors, in a vehicle to communicate with one another. The apparatus includes a device for changing a behavior of the communication device, which device is configured to activate the change in the behavior of the communication device if at least one boundary condition, on which activation of the fault diagnosis depends, is satisfied. The apparatus also includes artificial intelligence which is configured to determine the at least one boundary condition on the basis of an internal state of at least one participant.

7 Claims, 2 Drawing Sheets

APPARATUS AND METHOD FOR DIAGNOSING FAULTS

CROSS-REFERENCE TO RELATED APPLICATION

Figure 1:
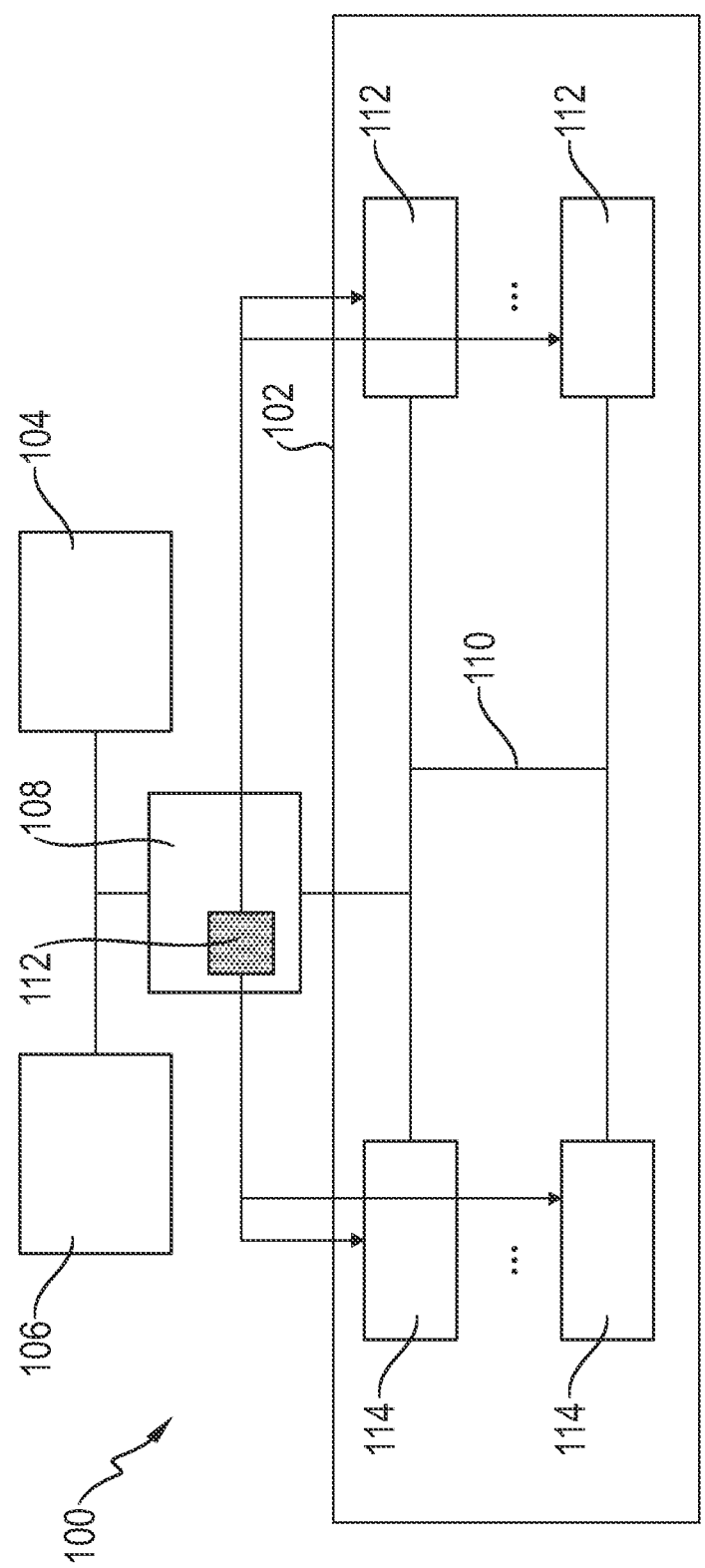

This application claims priority to German Patent Application No.: 10 2021 117 498.8, filed Jul. 7, 2021, the content of such application being incorporated by reference herein in its entirety.

FIELD OF THE INVENTION

The invention relates to an apparatus and a method for diagnosing faults.

BACKGROUND OF THE INVENTION

In a Production Vehicle Evaluation, PVE, a check must be carried out on selected vehicles in order to determine whether their fault diagnosis, for example on-board diagnosis, has been correctly provided with data.

In this respect, the provision of data for each vehicle must be checked for a multiplicity of faults of the order of magnitude of approximately 1500 faults.

U.S. Ser. No. 10/410,115, which is incorporated herein by reference, discloses that vehicle data for diagnosing faults are evaluated using AI.

SUMMARY OF THE INVENTION

It is desirable to further accelerate the check of the provision of data in comparison with the foregoing and to enable it at lower costs.

An apparatus for diagnosing faults comprises an interface to a communication means which can be used by participants, in particular control devices and/or sensors, in a vehicle to communicate with one another, wherein the apparatus comprises a device for changing a behavior of the communication means, which device is designed to activate the change in the behavior of the communication means if at least one boundary condition, on which activation of the fault diagnosis depends, is satisfied, wherein the apparatus comprises artificial intelligence which is designed to determine the at least one boundary condition on the basis of an internal state of at least one participant. The fault diagnosis must be carried out on the basis of the internal states under different boundary conditions. The respective boundary conditions are determined in a particularly efficient manner by the artificial intelligence. This enables accelerated testing at lower costs.

The artificial intelligence is preferably designed to map the internal state of at least one participant to intervention in the communication between the participants, in particular via a data bus.

The artificial intelligence is preferably designed to map the internal state of at least one participant to a simulation of at least one physical measured value for at least one of the participants.

The artificial intelligence is preferably designed to map the internal state of at least one participant to at least one electrical fault, in particular a short circuit, in the communication means.

The apparatus may be designed to provide at least one boundary condition in the vehicle, on which the activation of the fault diagnosis depends, in particular via a diagnostic interface and/or by changing the behavior of the communication means.

A method for diagnosing faults provides for a change in a behavior of a communication means in a vehicle, which can be used by participants, in particular control devices and/or sensors, to communicate with one another, to be activated if at least one boundary condition, on which activation of the fault diagnosis depends, is satisfied, wherein the at least one boundary condition is determined by artificial intelligence on the basis of an internal state of at least one participant.

The artificial intelligence preferably maps the internal state of at least one participant to intervention in the communication between the participants, in particular via a data bus.

The artificial intelligence preferably maps the internal state of at least one participant to a simulation of at least one physical measured value for at least one of the participants.

The artificial intelligence preferably maps the internal state of at least one participant to at least one electrical fault, in particular a short circuit, in the communication means.

The method may provide for at least one boundary condition in the vehicle, on which the activation of the fault diagnosis depends, to be provided, in particular via a diagnostic interface and/or by changing the behavior of the communication means.

BRIEF DESCRIPTION OF THE DRAWING FIGURES

Figure 2:
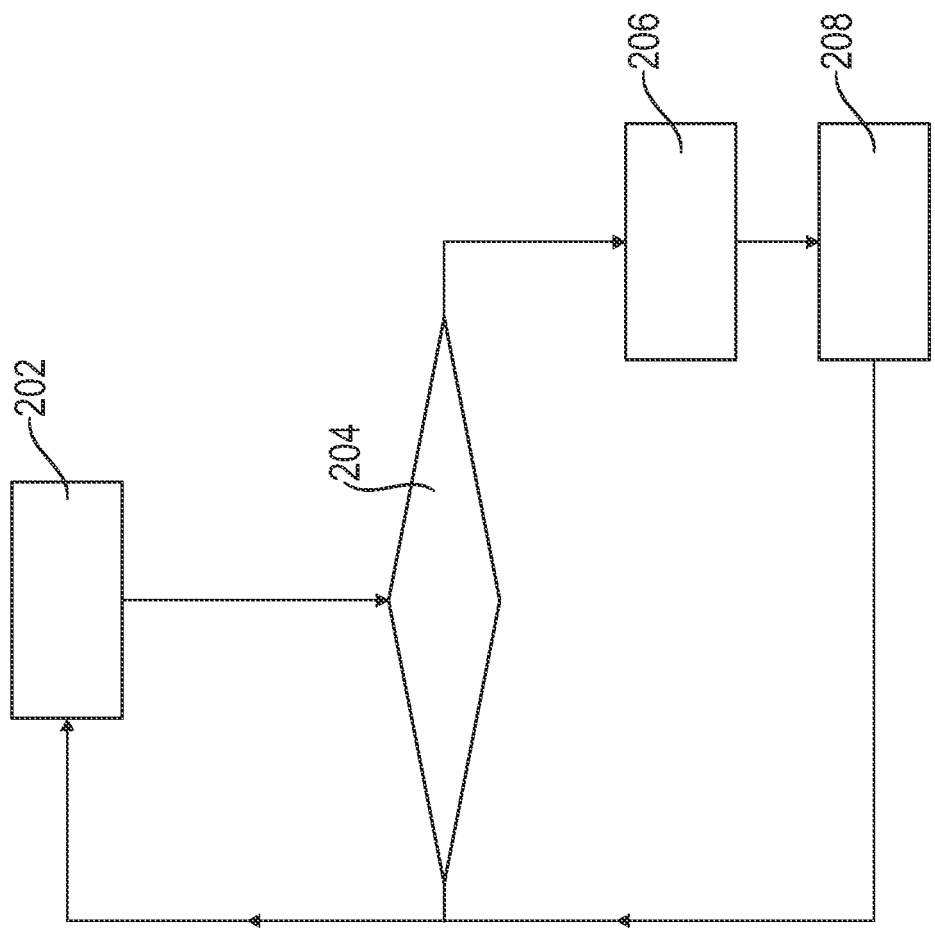

Further advantageous embodiments emerge from the following description and the drawing, in which:

FIG. 1 shows a schematic illustration of part of an apparatus for diagnosing faults, and FIG. 2 shows a method for diagnosing faults.

DETAILED DESCRIPTION OF THE INVENTION

FIG. 1 schematically illustrates an apparatus 100 for diagnosing faults in a vehicle 102.

The apparatus 100 comprises a device 104, artificial intelligence 106 and an interface 108 to a communication means 110 in the vehicle 102. Details in connection with artificial intelligence 106 may be found in U.S. Ser. No. 10/410,115, which is incorporated by reference herein in its entirety and for all purposes.

The communication means 110 can be used by participants, in particular control devices 112 and/or sensors 114, in the vehicle 102 to communicate with one another.

The device 104 is designed to change a behavior of the communication means 110. A boundary condition or boundary conditions required for the fault diagnosis can be produced by changing the behavior.

The device 104 is designed to activate the change in the behavior of the communication means 110 if at least one boundary condition, on which activation of the fault diagnosis depends, is satisfied.

The artificial intelligence 106 is designed to determine the at least one boundary condition on the basis of an internal state of at least one participant.

In the example, the interface 108 comprises a diagnostic interface 112 which can be used to query or receive the internal state of participants. The diagnostic interface may be an on-board diagnostic interface, OBD II. The diagnostic interface 112 may be designed to control at least one participant according to a boundary condition.

The communication means 110 may comprise a data bus for communicating and/or transmitting measured values. The communication means 110 may comprise a cable harness for communicating and/or transmitting measured values.

The artificial intelligence 106 may be designed to map the internal state of at least one participant to intervention in the communication between the participants, in particular via the data bus.

The artificial intelligence 106 may be designed to map the internal state of at least one participant to a simulation of at least one physical measured value for at least one of the participants.

The artificial intelligence 106 may be designed to map the internal state of at least one participant to at least one electrical fault, in particular a short circuit, in the communication means 110.

In the example, the artificial intelligence 106 is trained in advance to map the internal state of a participant or the internal state of a plurality of participants to a boundary condition or to a plurality of boundary conditions for activation. Training of the artificial intelligence 106 using training data may be provided for this purpose. The training data may comprise test cases, for example OBD II test cases, which define mutually associated internal states and boundary conditions.

A method for diagnosing faults is described below with reference to FIG. 2.

The method comprises a step 202.

In step 202, at least one boundary condition for a test case is determined by the artificial intelligence 106 on the basis of an internal state of at least one participant. A boundary condition may relate, for example, to intervention in the communication between some or all participants, a physical measured value for at least one of the participants and/or an electrical fault.

The artificial intelligence 106 may map the internal state of at least one participant to intervention in the communication between the participants, in particular via the data bus.

The artificial intelligence 106 may map the internal state of at least one participant to a simulation of at least one physical measured value for at least one of the participants.

The artificial intelligence 106 may map the internal state of at least one participant to at least one electrical fault, in particular a short circuit, in the communication means.

Provision may be made for a boundary condition or a plurality of boundary conditions, which are predefined for the fault diagnosis, to be provided, in particular by means of the diagnostic interface 112 by communicating with at least one participant.

A step 204 is then carried out.

Step 204 checks whether the at least one boundary condition, on which activation of the fault diagnosis depends, is satisfied.

If at least one boundary condition, on which the activation of the fault diagnosis depends, is satisfied 204, a step 206 is carried out. Otherwise, step 202 is carried out.

In step 206, the change in the behavior of the communication means 110, to which the artificial intelligence 106 has mapped the internal state, is activated.

In the example, intervention in the communication between the participants, in particular via the data bus, a simulation of at least one physical measured value for at least one of the participants, an electrical fault, in particular a short circuit, in the communication means 110 are provided. The method is not restricted to these examples. Other test cases with other faults may also be provided.

A step 208 is then carried out.

In step 208, a result of the fault diagnosis for this test case is determined, output and/or stored. For example, test cases from a production vehicle evaluation fault are simulated and a response of a control device and/or a malfunction indicator light, MIL, is captured as the result.

Step 202 is then carried out.

Provision may be made for the steps to be repeated until a desired number of test cases have been checked.

In the context of the invention, artificial intelligence (AI) may be carried out by a processor. The processor can be understood to mean a machine or an electronic circuit, for example. In particular, a processor can be a central processing unit (CPU), a microprocessor or microcontroller, for example an application-specific integrated circuit or digital signal processor, possibly in combination with a data storage unit for storing program commands, etc. Additionally, a processor can be understood to be a virtual processor, a virtual machine or soft CPU. The AI may be a program that is stored in the memory of the machine.

What is claimed:

1. An apparatus for diagnosing faults comprising:
an interface to a communication means which is configured to be used by one or more participants, including control devices and/or sensors, in a vehicle to communicate with one another, and
a device for changing a behavior of the communication means, said device being configured to activate a change in the behavior of the communication means if at least one boundary condition, on which activation of a fault diagnosis depends, is satisfied,
wherein the apparatus comprises artificial intelligence which is configured to determine the at least one boundary condition by mapping an internal state of at least one participant to a simulation of at least one physical measured value for at least one of the participants, and
wherein the simulation of the at least one physical measured value is performed by changing the communication between the participants connected by the communication means or by inducing a short circuit in the communication means.

2. The apparatus as claimed in claim 1, wherein the artificial intelligence is configured to map the internal state of at least one of the participants to an intervention in the communication between the participants, via a data bus.

3. The apparatus as claimed in claim 1, wherein the artificial intelligence is configured to map the internal state of at least one of the participants to at least one electrical fault in the communication means.

4. The apparatus as claimed in claim 1, wherein the apparatus is configured to provide the at least one boundary condition via a diagnostic interface.

5. The apparatus as claimed in claim 1, wherein the apparatus is configured to provide the at least one boundary condition by changing the behavior of the communication means.

6. The apparatus as claimed in claim 1, wherein at least one electrical fault comprises a short circuit in the communication means.

7. The apparatus as claimed in claim 1, wherein the at least one boundary condition relates to intervention in the communication between some or all of the participants, a physical measured value for at least one of the participants, and/or an electrical fault.

\* \* \* \* \*